(12) United States Patent
Muff et al.

(10) Patent No.: US 6,911,732 B2
(45) Date of Patent: Jun. 28, 2005

(54) INTEGRATED CIRCUIT

(75) Inventors: Simon Muff, Hohenkirchen (DE); Martin Gall, Munich (DE); Andre Schaefer, Munich (DE); Georg Braun, Munich (DE)

(73) Assignee: Infineon Technologies AG, Munich (DE)

( * ) Notice: Subject to any disclaimer, the term of this patent is extended or adjusted under 35 U.S.C. 154(b) by 251 days.

(21) Appl. No.: 10/137,511

(22) Filed: Apr. 30, 2002

(65) Prior Publication Data

US 2004/0145036 A1 Jul. 29, 2004

(30) Foreign Application Priority Data

Apr. 30, 2001 (DE) .......................................... 101 21 241

(51) Int. Cl.$^7$ .............................................. H01L 23/34
(52) U.S. Cl. ....................... 257/728; 257/690; 257/691; 257/664; 257/678
(58) Field of Search ................................ 257/728, 664, 257/691, 678

(56) References Cited

U.S. PATENT DOCUMENTS

| 5,798,571 | A | | 8/1998 | Nakajima ..................... 257/784 |
| 6,057,596 | A | | 5/2000 | Lin et al. ..................... 257/697 |
| 6,114,751 | A | * | 9/2000 | Kumakura et al. ......... 257/666 |
| 6,163,071 | A | | 12/2000 | Yamamura .................. 257/691 |
| 6,363,426 | B1 | * | 3/2002 | Yon et al. .................... 709/226 |

OTHER PUBLICATIONS

German office action, Feb. 1, 2002.

* cited by examiner

*Primary Examiner*—Jasmine Clark
(74) *Attorney, Agent, or Firm*—Fish & Richardson P.C.

(57) ABSTRACT

An integrated circuit which is integrated in a housing having connecting pins fitted to the housing for connecting the housing to signal lines of an external circuit, each connecting pin connected by an associated wiring line to a contact pad of the circuit integrated in the housing, to exchange signals between the external circuit and the integrated circuit, where to minimize the line lengths of the associated wiring lines, the connecting pins to be connected to signal lines for high-frequency signals are fitted centrally to the housing.

21 Claims, 2 Drawing Sheets

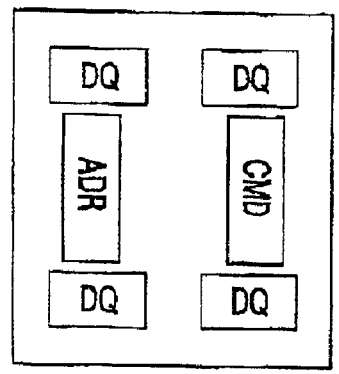
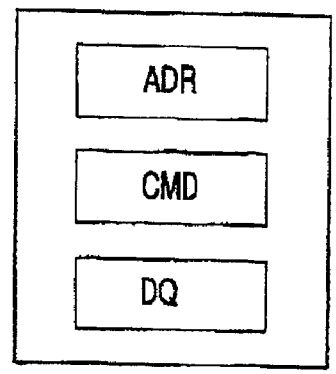
Fig. 2a    Fig. 2b
(Prior Art)
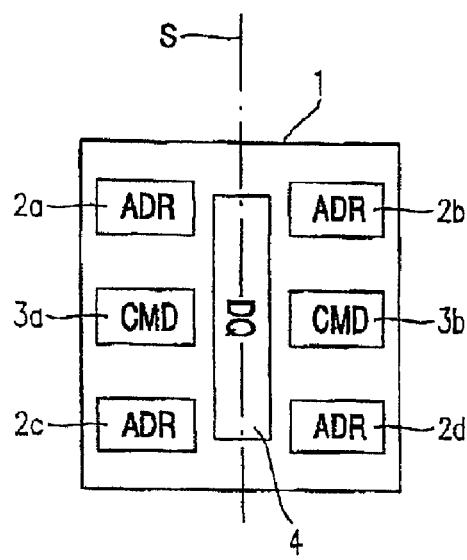
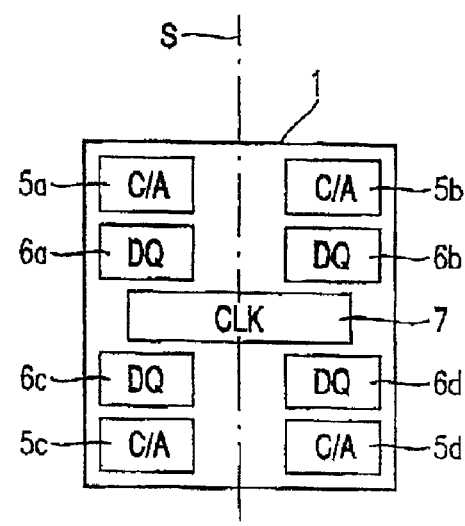
Fig. 3a    Fig. 3b

INTEGRATED CIRCUIT

CLAIM OF PRIORITY

Pursuant to 35 U.S.C. 119(a)–(d), this application claims priority from German application no. 101 21 241.0, filed with the German Patent Office, Germany, on Apr. 30, 2001.

FIELD OF INVENTION

The invention relates to a circuit integrated in a housing, in which, in order to minimize the [lacuna] of the associated wiring lines, the connecting pins for high-frequency signals are fitted centrally to the housing.

BACKGROUND

Following their production, integrated circuits are packaged in a housing. Here, integrated circuits are considerably smaller than the associated housing. The connecting pins for connecting the integrated circuit to an external circuit, which pins are located on the housing, are connected via internal wiring lines to contact PADS in order to make electric contact with the electronic circuit.

FIG. 1 shows an arrangement according to the prior art. The connecting pins fitted to the housing are connected via wiring lines to contact PADS on a circuit integrated in the housing. In this case, the connecting pins are conventionally fitted in the manner of a matrix to the underside of the housing. The contact PADS are located on a line of symmetry S, so that in the event of further miniaturization (shrink) of the integrated circuit within the housing, the position of the contact PADS can remain constant. The size of the integrated circuits or the chip size in the case of conventional chips is around 50 mm$^2$. The further the miniaturization of integrated circuits progresses, the greater the line lengths become of the wiring lines to the external connecting pins.

FIGS. 2a, 2b show the arrangement of connecting pins on the underside of circuits integrated in housings, in accordance with the prior art.

In the arrangement according to the prior art, illustrated in FIG. 2a, the address lines ADR for addressing memory cells within the integrated circuit, and the control signal connecting pins (CMD) for applying control signals are arranged centrally, while the connecting pins are fitted above the data lines (Dq) in four groups in a peripheral position on the underside of the housing.

FIG. 2b shows a further arrangement of connecting pins in integrated circuits according to the prior art. In the arrangement illustrated in FIG. 2b, the address connecting pins ADR, the control signal connecting pins CMD and the data connecting pins DQ are likewise arranged in groups on the underside of the housing. In this case, the control signal connecting pins are located in the center of the housing, while the address connecting pins and the data connecting pins are arranged peripherally. In this case, the data connecting pins DQ are conventionally fitted to the side on which there is a data connecting plug on the circuit board.

The disadvantage of the connecting pin arrangements illustrated in FIGS. 2a, 2b is that the wiring lengths of the wiring lines between peripherally arranged connecting pins and the contact PADS within the integrated circuit increase with increasing miniaturization of the circuit integrated in the housing. Since, at the same time, the operating clock frequencies of modern integrated circuits are increasing and, for example, are already some hundreds of MHz in modern DRAM memories, so that data rates of more than 800 megabit per second can occur, the line inductance of wiring lines between the connecting pins and the contact PADS play an increasing role. The greater the line inductance in the wiring lines, the lower the signal integrity of the signal carried over the wiring line. As compared with the signal frequencies of the data signals DQ, the signal frequencies of the address signals ADR and of the control signals CMD are comparatively low.

The arrangements of the connecting pins illustrated in FIGS. 2a, 2b therefore exhibit the disadvantage that it is precisely the data signals, which have a very high signal frequency, that are arranged in a peripheral position, so that because of the relatively great lengths of the wiring lines and the associated high line inductances, they have a low signal integrity and it is therefore possible for data transmission errors to occur.

SUMMARY

It is therefore the object of the present invention to provide an integrated circuit which has high signal integrity, even at very high signal frequencies.

The invention provides an integrated circuit which is integrated in a housing, comprising a plurality of connecting pins fitted to the housing for connecting the housing to signal lines of an external circuit, each connecting pin being connected via an associated wiring line to a contact PAD of the circuit integrated in the housing, to exchange signals between the external circuit and the integrated circuit, the integrated circuit according to the invention being characterized in that in order to minimize the line lengths of the associated wiring lines, the connecting pins to be connected to signal lines for high-frequency signals are fitted centrally to the housing.

In a further preferred embodiment of the integrated circuit according to the invention, the connecting pins are fitted in a manner of a matrix to the circuit integrated in the housing.

The line inductance of the wiring lines for connecting the integrated circuit to the signal lines for high-frequency external signals is preferably minimal.

In a particularly preferred embodiment of the integrated circuit according to the invention, the contact PADS are arranged along a line of symmetry on the housing.

In a further particularly preferred embodiment of the integrated circuit according to the invention, the data connecting pins to be connected to data signal lines and the associated ground connecting pins are arranged along the line of symmetry in a central position on the housing.

In a further preferred embodiment of the integrated circuit, the clock connecting pins to be connected to clock signal lines and the associated ground connecting pins are arranged in groups along a line of symmetry in a central position on the housing.

In a further preferred embodiment of the integrated circuit according to the invention, address connecting pins to be connected to address signal lines and the associated ground connecting pins are arranged in groups in a peripheral position on the housing.

In a further preferred embodiment of the integrated circuit according to the invention, the control connecting pins to be connected to control signal lines and the associated ground connecting pins are fitted in groups in a peripheral position on the housing.

In a further preferred embodiment of the integrated circuit according to the invention, the data connecting pins and the clock connecting pins to be connected to clock signal lines are arranged close to one another.

In a particularly preferred embodiment of the integrated circuit according to the invention, the line inductances of wiring lines for the connecting pins to be connected to external signal lines for high-frequency signals are some nhenry smaller than the line inductances of wiring lines of the connecting pins to be connected to external signal lines for low-frequency signals.

In a particularly preferred embodiment of the integrated circuit according to the invention, the line inductances of wiring lines of the connecting pins to be connected to signal lines for high-frequency signals are less than 3.25 nhenry.

In a particularly preferred embodiment of the integrated circuit according to the invention, the integrated circuit is an integrated memory, which is packaged in a housing which has address connecting pins for addressing memory cells, data connecting pins for data transmission, control signal connecting pins for control signal transmission, ground connecting pins and clock signal connecting pins.

Preferred embodiments of the integrated circuit according to the invention will be described below with reference to the appended figures in order to explain features essential to the invention.

BRIEF DESCRIPTION OF THE DRAWINGS

FIG. 2 shows an arrangement of connecting pins in a housing of a conventional integrated circuit;

FIGS. 3a, 3b show embodiments of the integrated circuit according to the invention.

DETAILED DESCRIPTION

Figure 1:
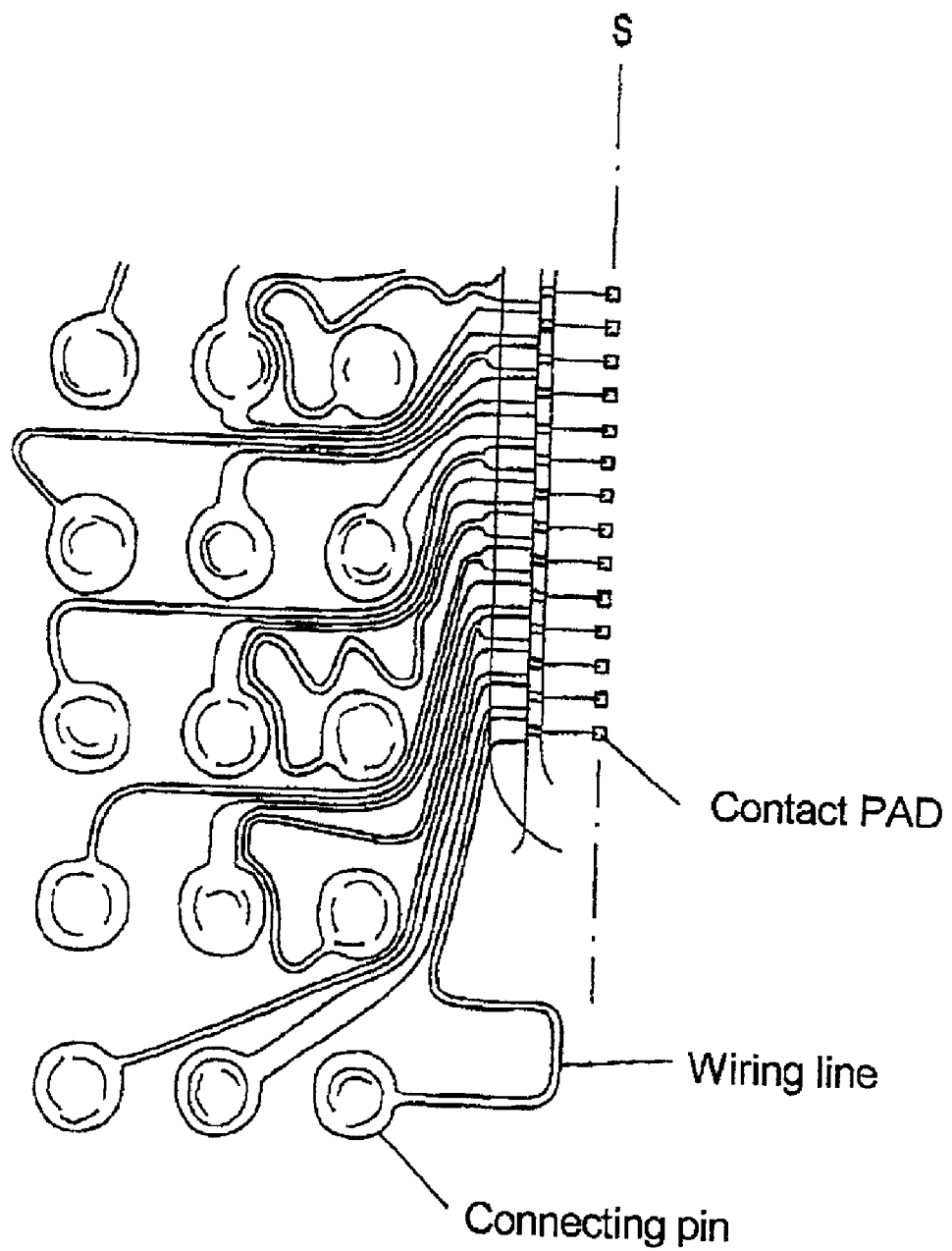
FIG. 1 shows a wiring arrangement according to the prior art.

FIG. 3a shows a first embodiment of the integrated circuit according to the invention. In the embodiment illustrated in FIG. 3a, the integrated circuit 1 is an integrated memory module. The integrated memory module 1 has address connecting pins 2a, 2b, 2c, 2d and associated ground connecting pins, which are arranged in a peripheral position at corners of the housing. The address connecting pins 2 [sic], 2b, 2c, 2d are connected via wiring lines to associated contact PADS, contained in the housing, to make contact with the integrated circuit 1 contained in the housing. The memory module 1 also has control signal connecting pins 3a, 3b to be connected to control signal lines. In addition, data connecting pins 4 are provided along a line of symmetry S of the housing 1, via which pins the memory module exchanges data with the external circuit. The data connecting pins to be connected to the data signal lines of the external circuit and the associated ground connecting pins are arranged along the line of symmetry S in a central position on the housing of the integrated circuit 1. In this way, the lengths of the associated wiring lines via which the high-frequency data signals are exchanged between the integrated circuit 1 and an external circuit are minimal. Consequently, the line inductances of the wiring lines for the data signals are likewise minimal, so that signal integrity is ensured even for the very high-frequency data signals which occur at data transmission rates of, for example, 800 Megabit per second.

The connecting pin configuration illustrated in FIG. 3a is also designated an OAIC configuration (OAIC: Outer Address Inner Command). The line inductances of the wiring lines for connecting the integrated circuit 1 to signal lines for the high-frequency data signals are minimal, while the line inductances of the wiring lines to the address signal lines for the relatively low-frequency address signals are comparatively high. On account of the relatively low signal frequency of the address signals applied, however, the relatively high line inductances do not have a disruptive effect on the operation of the integrated memory module 1. The line inductances of the wiring lines for connecting pins to be connected to the data signal lines for data exchange are lower than 3.25 nhenry in a particularly preferred embodiment of the integrated circuit according to the invention, so that data transmission rates of more than 800 Megabit per second are possible. Because of the symmetrical arrangement of the connecting pins on the housing, the line inductances of the connecting pins placed at the center for the high-frequency signals are constant in the event of technology-induced shrinking of the integrated circuit contained in the housing, while the line inductance of the connecting pins of the low-frequency signals increases.

The connecting pins for the various signals are fitted in the manner of a matrix to the underside of the housing of the integrated circuit 1. In this case, the connecting pins for the various functions, that is to say for example the address connecting pins, the control connecting pins, the data connecting pins and the associated ground and clock signal connecting pins, are arranged in groups on the housing.

FIG. 3b shows an alternative embodiment of the integrated circuit 1 according to the invention. In the embodiment shown in FIG. 3b, the control connecting pins and the address connecting pins are arranged in groups 5a, 5b, 5c, 5d in a peripheral position at the corners of the housing. The wiring lines for the relatively low-frequency address signals and control signals are therefore relatively high. Furthermore, the data connecting pins the [sic] in the embodiment shown in FIG. 3b are arranged in four groups 6a to d in a central position symmetrically with respect to the line of symmetry S. Furthermore, clock signal connecting pins are fitted in a group 7 symmetrically with respect to the line of symmetry S on the underside of the housing.

By means of the connecting pin arrangement shown in FIG. 3b, the data connecting pins are arranged in relation to the associated clock signal connecting pins in such a way that the propagation time differences between a data signal and an associated clock signal are minimal.

Having described the invention, and a preferred embodiment thereof, what is claim as new, and secured by Letters Patent is:

1. An integrated circuit comprising:
   a plurality of connecting pins fitted in a housing for connecting the housing to signal lines of an external circuit for high-frequency signals; and
   a wiring line connecting the plurality of connecting pins to a contact pad of the circuit to exchange signals between the external circuit and the integrated circuit,
   wherein the plurality of connecting pins is centrally fitted to the housing to minimize line lengths of the wiring line; and
   wherein the plurality of connecting pins is fitted in a matrix in the housing of the integrated circuit.

2. The integrated circuit of claim 1 wherein line inductance of the wiring lines for connecting the integrated circuit to the signal lines for high-frequency signals less than 3.25 nH (nanoHenry).

3. The integrated circuit of claim 1 wherein the contact pad is arranged along a line of symmetry of the housing.

4. The integrated circuit of claim 1 wherein the plurality of connecting pins comprises data connecting pins and associated ground connecting pins, and the data connecting pins to be connected to data signal lines and the associated ground connecting pins are arranged in groups along a line of symmetry in a central position on the housing.

5. The integrated circuit of claim 1 wherein the plurality of connecting pins comprises clock signal connecting pins and associated ground connecting pins, and the data connecting pins to be connected to clock signal lines and the associated ground connecting pins are arranged in groups along the line of symmetry in a central position on the housing.

6. The integrated circuit of claim 1 wherein the plurality of connecting pins comprises address connecting pins and associated ground connecting pins, and the address connecting pins to be connected to address signal lines and the associated ground connecting pins are fitted in groups in a peripheral position on the housing.

7. The integrated circuit of claim 1 wherein the plurality of connecting pins comprises control signal connecting pins and associated ground connecting pins, and the control signal connecting pins to be connected to control signal lines and the associated ground connecting pins are arranged in groups in a peripheral position on the housing.

8. The integrated circuit of claim 4 wherein the plurality of connecting pins further comprises clock signal connecting pins, and the data connecting pins and the clock signal connecting pins are arranged in close proximity to one another on the housing.

9. The integrated circuit of claim 2 wherein the line inductance of the wiring lines of the connecting pins for high-frequency signals is lower than the line inductance of the wiring lines of the connecting pins for low-frequency signals.

10. The integrated circuit of claim 1 wherein the integrated circuit comprises a memory.

11. A housing for an integrated circuit, the housing comprising a plurality of connecting pins for connecting the integrated circuit to external signal lines for high-frequency signals, wherein the plurality of connecting pins is centrally fitted in the housing to minimize line lengths of associated internal wiring lines.

12. The integrated circuit housing of claim 11 wherein the plurality of connecting pins is fitted in a matrix in the housing of the integrated circuit.

13. The integrated circuit housing of claim 11 wherein line inductance of the wiring lines for connecting the integrated circuit to the signal lines for high-frequency signals is less than 3.25 nH (nanoHenry).

14. The integrated circuit housing of claim 11 further comprising a contact pad arranged along a line of symmetry of the housing.

15. The integrated circuit housing of claim 11 wherein the plurality of connecting pins comprises data connecting pins and associated ground connecting pins, and the data connecting pins to be connected to data signal lines and the associated ground connecting pins are arranged in groups along the line of symmetry in a central position on the housing.

16. The integrated circuit housing of claim 11 wherein the plurality of connecting pins comprises clock signal connecting pins and associated ground connecting pins, and the data connecting pins to be connected to clock signal lines and the associated ground connecting pins are arranged in groups along the line of symmetry in a central position on the housing.

17. The integrated circuit housing of claim 11 wherein the plurality of connecting pins comprises address connecting pins and associated ground connecting pins, and the address connecting pins to be connected to address signal lines and the associated ground connecting pins are fitted in groups in a peripheral position on the housing.

18. The integrated circuit housing of claim 11 wherein the plurality of connecting pins comprises control signal connecting pins and associated ground connecting pins, and the control signal connecting pins to be connected to control signal lines and the associated ground connecting pins are arranged in groups in a peripheral position on the housing.

19. The integrated circuit housing of claim 15 wherein the plurality of connecting pins further comprises clock signal connecting pins, and the data connecting pins and the clock signal connecting pins are arranged close to one another on the housing.

20. The integrated circuit housing of claim 13 wherein the line inductance of the wiring lines of the connecting pins for high-frequency signals is lower than the line inductance of the wiring lines of the connecting pins for low-frequency signals.

21. The integrated circuit housing of claim 11 wherein the integrated circuit comprises a memory.

\* \* \* \* \*